(12) United States Patent
Winkler et al.

(10) Patent No.: US 10,514,606 B2
(45) Date of Patent: Dec. 24, 2019

(54) METHOD FOR ADJUSTING A LIGHTING SETTING

(71) Applicant: Carl Zeiss SMT GmbH, Oberkochen (DE)

(72) Inventors: Alexander Winkler, Heidenheim (DE); Daniel Lenz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/248,413

(22) Filed: Jan. 15, 2019

(65) Prior Publication Data

US 2019/0146353 A1    May 16, 2019

Related U.S. Application Data

(63) Continuation of application No. PCT/EP2017/066583, filed on Jul. 4, 2017.

(30) Foreign Application Priority Data

Jul. 27, 2016    (DE) .................. 10 2016 213 785

(51) Int. Cl.
*G03F 7/20* (2006.01)
*G02B 26/08* (2006.01)

(52) U.S. Cl.
CPC .......... *G03F 7/70116* (2013.01); *G03F 7/702* (2013.01); *G03F 7/70133* (2013.01); *G03F 7/70516* (2013.01); *G02B 26/0833* (2013.01)

(58) Field of Classification Search
CPC ............. G02B 26/0833; G03F 7/70091; G03F 7/70116; G03F 7/70133; G03F 7/702; G03F 7/705; G03F 7/70516

USPC ...................................... 355/67, 77
See application file for complete search history.

(56) References Cited

U.S. PATENT DOCUMENTS

| 2012/0262689 | A1 | 10/2012 | Van Ingen et al. |
| 2014/0055767 | A1 | 2/2014 | Waldis et al. |
| 2015/0153652 | A1 | 6/2015 | Zimmermann et al. |
| 2019/0004432 | A1 | 1/2019 | Gehrke et al. |

FOREIGN PATENT DOCUMENTS

| DE | 10 2011 006 100 A1 | 9/2012 |
| DE | 10 2012 212 664 A1 | 1/2014 |
| DE | 10 2013 203 689 A1 | 9/2014 |
| DE | 10 2014 220 203 A1 | 5/2015 |
| DE | 10 2014 223 326 A1 | 5/2016 |
| WO | WO 2004/092844 A2 | 10/2004 |
| WO | WO 2009/026947 A1 | 3/2009 |
| WO | WO 2012/130768 A2 | 10/2012 |

OTHER PUBLICATIONS

Translation of the International Search Report for corresponding PCT Appl No. PCT/EP2017/066583, dated Oct. 26, 2017.
German Examination Report, with translation thereof, for corresponding DE Appl No. 10 2016 213 785.9, dated Mar. 15, 2017.

*Primary Examiner* — Colin W Kreutzer
(74) *Attorney, Agent, or Firm* — Fish & Richardson P.C.

(57) ABSTRACT

A method for setting an illumination setting for illuminating an object field of a projection exposure apparatus includes taking into account the sensitivity of a performance variable for changes in the intensity of the illumination radiation in the illumination pupil.

19 Claims, 8 Drawing Sheets

METHOD FOR ADJUSTING A LIGHTING SETTING

CROSS-REFERENCE TO RELATED APPLICATIONS

The present application is a continuation of, and claims benefit under 35 USC 120 to, international application PCT/EP2017/066583, filed Jul. 4, 2017, which claims benefit under 35 USC 119 of German Application No. 10 2016 213 785.9, filed Jul. 27, 2016. The entire disclosure of these applications are incorporated by reference herein.

FIELD

The disclosure relates to a method for setting an illumination setting for illuminating an object field of a projection exposure apparatus. Moreover, the disclosure relates to a facet mirror for an illumination optical unit, an illumination optical unit and an illumination system, and also a microlithographic projection exposure apparatus. In addition, the disclosure relates to a method for producing a microstructured or nanostructured component and to a component produced according to the method.

BACKGROUND

A method for illuminating an object field of a projection exposure apparatus is known from DE 10 2013 203 689 A1, for example.

SUMMARY

The disclosure seeks to provide more robust methods for reducing the sensitivity in relation to disturbances and/or variations in the illumination radiation.

In one aspect, the disclosure provides a method for setting an illumination setting for illuminating an object field, which includes providing an illumination system for illuminating an object field with illumination radiation, and prescribing at least one parameter for characterizing the quality of the illumination of the object field. The method also includes determining a spatially resolved function of the dependence of the at least one parameter on a change in the intensity of the illumination radiation in the illumination pupil. The method further includes determining a norm of a directional derivative of this function, and adapting an illumination setting for illuminating the object field to the norm.

The disclosure involves adapting the illumination pupil, in particular the illumination setting, in such a way that illumination radiation is predominantly, in particular exclusively, directed into areas of the illumination pupil that have a low sensitivity in relation to shifts and/or variations in the intensity of the illumination radiation.

According to the disclosure, it was recognized that certain parameters for characterizing the quality of the illumination of the object field, so-called performance variables, have a different dependence on a change in intensity at a specific pupil location ($\Delta I(x,y)$). Further, it was determined that there are extended, contiguous areas in which the dependence of the performance variable on the change in intensity of the illumination radiation is constant. These areas, which are referred to as areas of constant sensitivity below, can be separated from one another by edges that are delimited relatively sharply. It was recognized that avoidance of the edge areas is advantageous for the stability of the illumination of an object field, i.e., it is advantageous if pupil spots are not arranged in the area of a delimiting edge between two areas of constant sensitivity in relation to changes in the intensity of the illumination radiation. Expressed differently, it is advantageous if at least the majority, in particular at least 60%, in particular at least 70%, in particular at least 80%, in particular at least 90%, of the pupil spots, in particular all pupil spots, are arranged in areas of constant sensitivity, in particular having a minimum distance from the edge areas between two areas of different sensitivity.

As a result of this, it is possible to reduce the sensitivity of the illumination pupil in relation to variations and/or disturbances of the illumination radiation. Hence, the illumination becomes more robust.

Using this, the performance of the pupil in real, tolerance-afflicted systems can be adapted to the design performance of an ideal system. In particular, this renders it possible for the chosen performance variable to approach its ideal value in the real system. As result of this, the precision of the illumination of the object field, and hence of the projection exposure apparatus, is improved, in particular.

In particular, provision is made for the illumination settings for illuminating the object field to be adapted to a norm of a directional derivative of a function that describes the dependence of the at least one parameter for characterizing the quality of the illumination of the object field on a change in the intensity distribution of the illumination radiation in the illumination pupil. By way of example, the norm can be a Sobel norm.

The illumination settings that can be adapted to the norm can be actually set illumination settings, illumination settings that are able to be set as a matter of principle, in particular all illumination settings that are able to be set or a selection of certain illumination settings, in particular illumination settings prescribed by a user.

The totality of the illumination channels that are used to illuminate the object field are referred to as illumination setting in each case. Here, the illumination channels are in each case formed, in particular, by assigning a facet of a first faceted element, in particular a first facet mirror, in particular a field facet mirror, to a facet of a second faceted element, in particular a second facet mirror, in particular a pupil facet mirror. The facets of the first facet element and/or the facets of the second facet element can have a monolithic embodiment in each case. They can also be embodied as virtual facets, in particular by a grouping of partial facets, in particular in the form of micromirrors. In principle, they can have a simple contiguous embodiment in each case or else include a plurality of separate, non-contiguous partial areas. In respect of details regarding the embodiment of the faceted elements, reference is made to the known prior art, in particular DE 10 2011 006 100 A1 and DE 10 2013 203 689 A1.

In particular, an illumination pupil refers to a specific selection of pupil spots from all possible pupil spots, from the areas of the illumination pupil used to illuminate the object field, which are illuminated by an illumination channel.

According to the disclosure, it was further recognized that the quality of the illumination of the object field or, in particular, of a reticle arranged in the object field with prescribed structures to be imaged depends firstly on these structures and secondly on the illumination pupil used to illuminate this reticle in each case. The quality of the illumination can be characterized by so-called performance variables, i.e., parameters for characterizing the quality of the illumination of the object field. By way of example, the position of an aerial image edge, in particular the position of an aerial image edge as a function of the location in the wafer plane, which is also referred to as imaging plane, can serve as a parameter for characterizing the quality of the illumination of the object field, wherein it is possible to take account of defocusing. So-called critical dimensions (CDs) can be calculated from the edge position. This is understood to mean, in particular, the distance between two aerial image edges for a defocusing of z=0. By way of example, a further parameter for characterizing the quality of the illumination of the object field is an overlay error, which specifies the offset that a structure experiences when varying z. This is also referred to as imaging telecentricity.

The use of the CD for characterizing the quality of the illumination of the object field is particularly common. In the case of masks, this variable lends itself, in particular, in the case of line-shaped structures. In particular, it lends itself to optimizing the illumination of relatively complex logic structures. Such structures predominantly or exclusively have line segments. In principle, corners and curves are also possible.

Further parameters for characterizing the quality of the illumination of the object field are: the uniformity of the CD (CDU), HV performance, line edge roughness, line width roughness, tip-to-tip distances of critical features, the edge slope (normalized image log slope, NILS), contrast. HV performance denotes the similarity/difference of the CD error for horizontal (H) and vertical (V) comparable structures. That is to say, if the CD error has the same magnitude, the same sign and the same amplitude for horizontal and vertical lines, for example, the HV performance is 0 (the best possible value).

According to one aspect of the disclosure, at least one of these performance variables is taken into account when adapting the illumination setting. According to a further aspect of the disclosure, provision is made of taking into account two or more of these performance variables when adapting the illumination setting.

By selecting the performance variables, which are taken into account when adapting the illumination setting, it is possible to determine which performance variables are robust, i.e., insensitive to disturbances and/or variations in the illumination radiation that may occur at any time in a real illumination system. In particular, the disturbances can be the geometric and/or energetic disturbances, for example on account of manufacturing tolerances and/or vibrations in the illumination system. What can be achieved by the method according to the disclosure for setting the illumination setting, in particular for adapting the illumination setting, is that the selected performance variables in the real system, i.e., during the actual operation of the projection exposure apparatus, are at least approximately as good as in an ideal system. As result of this, the actual achievable performance of the illumination system is significantly improved. In the best-case scenario, the actual performance of the illumination system is improved up to the theoretical performance of a system that is tolerance-free in view of a specific type of disturbance. It has emerged that the performance can be improved to an order of magnitude of 0.1% to 1% of the line width (critical dimension, CD), for example.

According to a further aspect of the disclosure, provision is made of taking account of additional boundary conditions, for example regarding the possible position of the pupil spots and/or regarding a minimum number of pupil spots, when adapting the illumination setting.

According to a further aspect of the disclosure, one or more predetermined mask structures and/or characteristics, in particular form and/or size and/or arrangement, of one or more aperture stops of the projection optical unit and/or a diameter of an illumination beam with illumination radiation are taken into account when determining the function for characterizing the dependence of the performance variable on a change in the intensity distribution of the illumination radiation in the illumination pupil.

According to the disclosure, it was recognized that these details have a substantial influence on the profile of the delimiting edges between areas of different sensitivities.

For the purposes of adapting the illumination pupil, a distribution and/or intensity of a plurality of pupil spots is adapted according to a further aspect of the disclosure.

In particular, the pupil spots can be moved out of edge areas between regions of different sensitivity and into areas with constant sensitivity. By way of example, this is possible by displacing the first facets, i.e., by way of an appropriate selection of the illumination channels in the case of discrete second facets. In the case of virtual facets, in particular facets with a plurality of separate partial facets, this is possible with great flexibility. It is also possible to displace facet elements, which are arranged in the area of the delimiting edges of areas of constant sensitivity, in such a way that the illumination radiation incident thereon is no longer guided to the object field.

For the purposes of adapting the illumination pupil, provision is made for a plurality of pupil spots to be displaced according to a further aspect of the disclosure. In particular, the pupil spots are displaced proceeding from a predetermined arrangement (default setting).

According to one aspect of the disclosure, provision is made, in particular, for a plurality of individual mirrors of the first and/or the second facet mirror of the illumination optical unit to be displaced for the purposes of displacing the pupil spots.

For the purposes of adapting the illumination pupil, the illumination pupil is rotated and/or displaced as a whole according to a further aspect of the disclosure. In particular, it is rotated relative to the optical axis, i.e., about the optical axis, and/or displaced perpendicular thereto.

In particular, provision can be made for the illumination pupil to be rotated and/or displaced relative to the alignment of the reticle.

According to the disclosure, it was recognized that this renders it possible to reduce the number of pupil spots that lie in the area of an edge between areas of different sensitivity. In particular, it is possible to avoid axes of a lattice structure, on which the pupil spots are arranged, from coinciding with an orientation of edges, which arise by diffracting the illumination radiation at the structures of the reticle and/or the aperture stop of the imaging optical unit.

Such a rotation and/or displacement of the illumination pupil can be prescribed by an appropriate design of the hardware, in particular of the pupil facet mirror, and can be consequently anchored in the system. There can also be a dynamic alignment of the illumination pupil relative to the alignment of the reticle, in particular a rotation and/or a displacement of the illumination pupil relative to the alignment of the reticle, in the case of a design of the pupil facet mirror with switchable facets, in particular in the case of a design of the pupil facet mirror as a MEMS-MMA. In the case of an illumination optical unit with a specular reflector, a movement of the pupil is even possible pixel-by-pixel, with a pixel being provided by the smallest MEMS unit.

In particular, the illumination pupil can be adapted by a rotation of the pupil facet mirror by a few degrees. In particular, the pupil facet mirror can be rotated in an angular range of up to 5°. Larger rotations can be emulated by a change of setting. Such a change of setting can act like a global rotation.

According to a further aspect of the disclosure, an optimization method, in particular a software-assisted and/or computer-assisted optimization method, is used to adapt the illumination pupil.

Precisely in the case of a large number of pupil spots, there are, as a rule, many different options for adapting the illumination pupil, i.e., the illumination setting, to the above-described norm, in particular to the profile of the delimiting edges between areas of different sensitivity. By using an optimization method, it is possible to establish particularly advantageous illumination pupils, possibly while taking account of additionally prescribed boundary conditions.

A control unit, in particular a computer-assisted control unit, can be provided for carrying out the optimization method.

For the purposes of adapting the illumination pupil, provision is made, according to a further aspect of the disclosure, for an arrangement of facets on a facet mirror to be adapted to the above-described norm in such a way that at least a subset of the facet mirrors has a predetermined minimum distance ($d_{min}$) from areas in which the norm is greater than a predetermined maximum value.

On account of the minimum distance of the facet from the edge areas, it is possible to ensure that the selected performance variables are robust in relation to variations of the illumination radiation. In particular, the minimum distance can be chosen depending on the magnitude of the expected variation in the illumination radiation. In particular, the minimum distance ($d_{min}$) can be at least 100 μm, in particular at least 200 μm, in particular at least 300 μm, in particular at least 500 μm, in particular at least 1 mm, in particular at least 1 cm. In particular, the minimum distance ($d_{min}$) corresponds to the sum of the spot diameter of the image of the radiation source in the intermediate focus and the expected disturbance amplitude of same, wherein these variables should already be considered in the pupil facet coordinate system. Here, the disturbance amplitude is restricted by the size of the pupil facets.

According to a further aspect of the disclosure, a certain feature of the structures is initially selected in a method for designing a pupil facet mirror. Thereupon, the edge between areas of constant sensitivity that is relevant to this variable is selected and it is ensured that all pupil facets have a predetermined minimum distance from this edge. When considered the other way around, this leads to all pupil spots maintaining a minimum distance $d_{min}$ to the images of zero order of diffraction of every edge of obscured areas of the imaging aperture, particularly if the diffraction limit has not been reached by the mask structure and on the reticle. The image of the zero order of diffraction of the imaging aperture of an otherwise obscuration-free imaging aperture corresponds to the centered complete circle in FIG. 4, for example.

A corresponding arrangement of the pupil spots is particularly advantageous since the image of the zero order of diffraction is independent of details of the mask structures on the reticle.

According to a further aspect of the disclosure, the illumination setting is adapted during the exposure of a wafer. In particular, it can be adapted in-line, i.e., during the operation of the projection exposure apparatus, in particular adapted dynamically. In a preferred variant, provision is made for one or more sensors to be provided for the purposes of capturing variations in the illumination radiation. In particular, the sensors can be arranged in the region of the pupil plane or in a plane conjugate thereto or in the region of the object plane. Preferably, they have a signal-transmitting connection to the control device for the purposes of adapting the illumination setting.

Such a dynamic adaptation of the illumination setting is advantageous, in particular in conjunction with an illumination system with variable facets, in particular with virtual facets, in particular with facets that are realized by a micromirror array (MMA), in particular a microelectromechanical MMA (MEMS-MMA, microelectromechanical system MMA).

For the purposes of adapting the illumination setting, according to a further aspect of the disclosure a coordinate system is defined for a process window, in which coordinate system at least one coordinate takes account of one or more system-internal parameters of the illumination system, and the illumination system is adapted in such a way that the process window is increased in the direction of this at least one coordinate.

Here, a multidimensional parameter range, in which an error in the performance of the illumination system, in particular a deviation of the parameter (P) from a setpoint value, is no greater than a predetermined limit, is referred to as a process window.

In particular, it is possible to plot the drift amplitude of the illumination spots on the corresponding coordinate, in particular on the corresponding axis of the coordinate space of the process window. The process window can be enlarged in the direction of this axis by avoiding the arrangement of illumination spots in certain, prescribed so-called forbidden zones. It is also possible to increase the process window in the direction of a plurality of axes.

The disclosure also seeks to provide improved a facet mirror for an illumination optical unit, an illumination optical unit, and an illumination system for a projection exposure apparatus, and a projection exposure apparatus.

Each is achieved by a facet mirror, in which at least a subset of the facets are arranged in such a way that they each have a minimum distance from prescribed areas, or by virtue of the adjustable illumination settings being adaptable according to the preceding description. In particular, a control device is provided for adapting the illumination settings.

It is possible that individual facets are not used to illuminate the object field.

In particular, the illumination optical unit includes two facet mirrors, wherein the facets of the second facet mirror are arranged according to the preceding description.

According to one aspect of the disclosure, the control device is embodied in such a way that it has a data-transmitting connection to a memory, in which values of the above-described norm are saved. This facilitates the adaptation of the illumination setting.

The radiation source is, in particular, an EUV radiation source, i.e., a radiation source for producing illumination radiation in the EUV wavelength range.

Further aspects of the disclosure are to improve a method for producing a microstructured or nanostructured component, and a correspondingly produced component. These aspects are achieved by adapting the illumination setting for illuminating the object field according to the above-described description. The advantages are evident from those described above.

BRIEF DESCRIPTION OF THE DRAWINGS

Further advantages, details and particulars of the disclosure are evident from the description of exemplary embodiments with reference to the drawings, in which.

DESCRIPTION OF EXEMPLARY EMBODIMENTS

Initially, generic details of the design and the constituent parts of the projection exposure apparatus 1 are described with reference to FIGS. 1 and 2.

Figure 1:
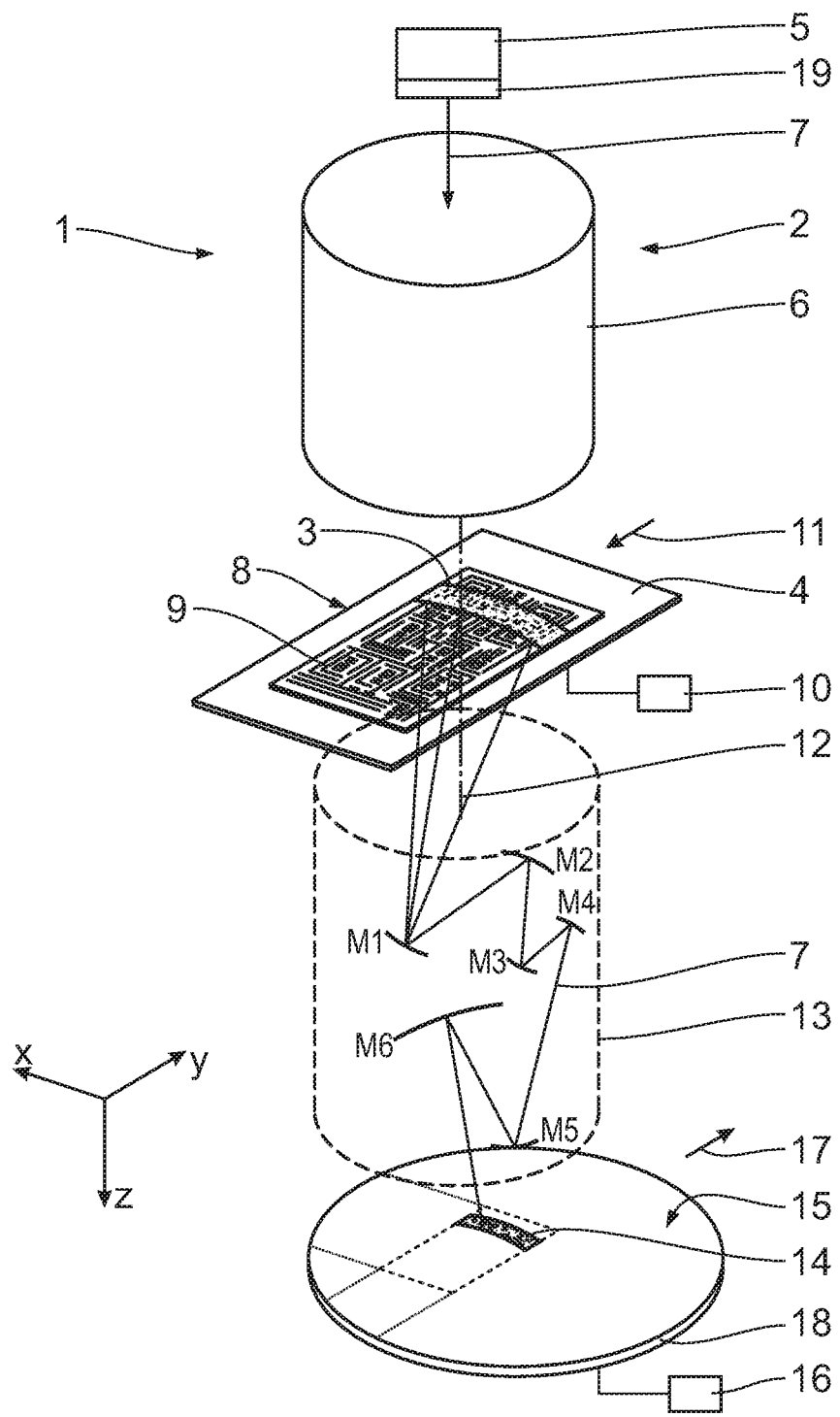
FIG. 1 schematically shows the design of a microlithographic projection exposure apparatus.
Figure 2:
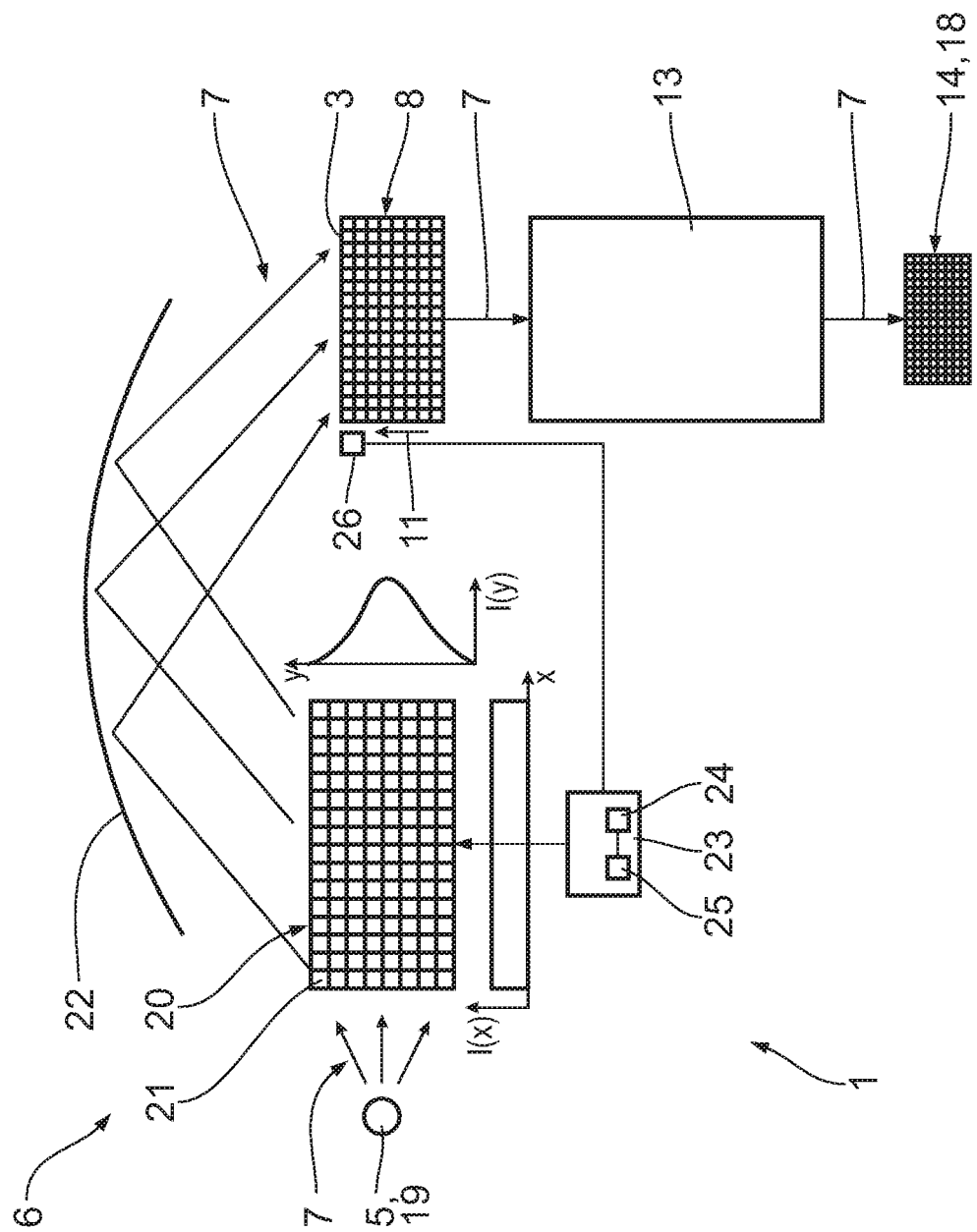
FIG. 2 shows a schematic illustration of the beam path in a projection exposure apparatus according to FIG. 1, FIG. 3 schematically shows an illustration of the dependence of a performance variable P as a function of a change in intensity ΔI(x,y) of the illumination radiation in the illumination pupil, FIG. 4 schematically shows the norm N of a directional derivative of the function illustrated in FIG. 3.

In a very schematic illustration, FIG. 1 shows the basic design of a microlithographic projection exposure apparatus 1. The projection exposure apparatus 1 includes an illumination system 2 for illuminating an object field 3 in an object plane 4. The illumination system 2 includes a radiation source 5 and an illumination optical unit 6 for transferring illumination radiation 7 from the radiation source 5 into the object field 3. The radiation source 5 can be provided with a collector 19 for beam-shaping. A mask 8 with structures 9 to be imaged, which is also referred to as a reticle, is arranged in the object plane 4. The mask 8 is held by a reticle holder 10. In particular, it is displaceable in a scanning direction 11 with the aid of the reticle holder 10.

A Cartesian xyz-coordinate system is plotted for reasons of simplicity. The y-direction of same is parallel to the scanning direction 11. The object plane 4 is parallel to the xy-plane. The z-direction is parallel to an optical axis 12 of the projection exposure apparatus 1.

Moreover, the projection exposure apparatus 1 includes a projection optical unit 13 for projecting the object field 3 into an image field 14 in an image plane 15. A wafer 18 that is displaceable in a scanning direction 17 via a wafer holder 16 is mounted in the image plane 15. The structures a of the reticle 8 are imaged onto the wafer 18 with the aid of the projection optical unit 13. The wafer 18 is provided with a radiation-sensitive coating, which is developed after the illumination.

While a projection exposure apparatus 1 in which illumination passes through the reticle 8 is illustrated in FIG. 1, a reflective embodiment of the reticle 8 and use of the latter in the reflection mode are also possible. In particular, this is provided if an EUV radiation source serves as a radiation source 5. In this case, the projection exposure apparatus 1, in particular the illumination optical unit 6 and the projection optical unit 13, can have a catoptric, i.e., purely reflective, embodiment. In the general case, the projection exposure apparatus 1, in particular the illumination optical unit 6 and/or the projection optical unit 13, can have a dioptric or catadioptric embodiment.

The projection optical unit 13 includes a plurality of projection mirrors $M_i$, which are numbered in the radiation direction, proceeding from the object field 3. Consequently, $M_1$ denotes the projection mirror that is arranged first in the radiation direction after the object field 3, $M_2$ denotes the second mirror, and so on. The projection optical unit 13 includes six projection mirrors $M_1$ to $M_6$. In particular, it generally includes at least four, in particular at least six, in particular at least eight, projection mirrors $M_i$.

In respect of further details relating to the projection exposure apparatus 1 and the components of same, reference is made to WO 2004/092844 A2 and WO 2009/026947 A1, which should both form part of the present application in their entirety.

The text below describes further details of the illumination unit 6 and of a method for illuminating the object field 3 and the image field 14 using a predetermined illumination setting.

FIG. 2 once again very schematically illustrates a beam path of the illumination radiation 7 in the projection exposure apparatus 1. As elucidated in FIG. 2 in exemplary fashion, the illumination optical unit 6 includes at least one mirror unit 20 with a multiplicity of individual mirrors 21. Moreover, the illumination optical unit 6 includes at least one further optical element 22. The at least one further optical element 22 serves to image the mirror unit 20 into the object field 3 in the object plane 4 in which the reticle 8 is arranged. In particular, the imaging is size-reducing imaging.

In general, the mirror units 20 forms a first faceted element, in particular a first facet mirror, in particular a field facet mirror, with a multiplicity of facets.

In general, the optical element 22 forms a second faceted element, in particular a second facet mirror, in particular a pupil facet mirror. In particular, it can likewise have a multiplicity of facets. In respect of details regarding the twice-faceted embodiment of the illumination optical unit 6 and, in particular, regarding the faceted elements, reference is made by way of example to WO 2009/0269547 A1 and WO 2012/130 768 A2, which should form part of the present application in their entirety.

The mirror unit 20 is embodied as a microelectromechanical system (MEMS). For details, reference is made, once again, to WO 2009/0269547 A1. However, it is also possible to embody the mirror unit 20 with monolithic individual mirrors 21.

In particular, the mirror unit 20 includes $N_x$ columns and $N_y$ rows of individual mirrors 21. Advantageously, the number $N_y$ of rows is between 30 and 500, in particular between 50 and 250. A number between 75 and 150 can be particularly advantageous.

In particular, the aspect ratio of the mirror unit 20, in particular the number $N_x:N_y$, corresponds precisely to the aspect ratio of the object field and/or that of the image field. In particular, the aspect ratio is greater than 4:1, in particular greater than 10:1.

In particular, the individual mirrors 21 are micromirrors, in particular with a reflection surface in the range from $10^{-10}$ $m^2$ to $10^{-4}$ $m^2$, in particular in the range from $10^{-8}$ $m^2$ to $10^{-6}$ $m^2$, in particular in the range from $10^{-7}$ $m^2$ to $10^{-6}$ $m^2$.

The individual mirrors 21 are displaceable in controlled fashion between different displacement positions. The individual mirrors 21 can be continuously displaceable. It is likewise possible to embody the individual mirrors 21 with discrete displacement positions. A control device 23 is provided for controlling the displacement of the individual mirrors 21.

The individual mirrors 21 are mounted, in particular in swivelable fashion. In particular, they can have one or two swiveling degrees of freedom. In particular, they are swivelable about swivel axes that extend parallel to the xy-plane. They can also be height adjustable, i.e., linearly displaceable in the z-direction.

The control device 23 includes a processor 24, by which the selection of the displacement positions of the individual mirrors 21 is optimizable according to an optimization algorithm for the purposes of setting a certain illumination setting. The method for setting a certain illumination setting will still be described in more detail below.

Moreover, the control device 23 includes a memory unit 25. Different settings of the individual mirrors 21 can be stored in the memory unit 25. In particular, it is possible to save different illumination settings, which are able to be set using the illumination system 2, in the memory unit 25. These can then be recalled in a particularly simple manner, in particular in a particularly fast manner.

Moreover, exception positions of the individual mirrors 21 can be stored. Here, an exception position is a displacement position of an individual mirror 21 that is possible in principle but has been removed in targeted fashion from the displacement positions that are able to be set. Expressed differently, these are forbidden positions that should not be adopted by the respective individual mirror 21.

Preferably, the memory unit 25 is programmable. It is connected in a data-transmitting manner to the processor 24.

Details of a method for illuminating the object field 3, in particular of a method for setting an illumination setting of the illumination optical unit 6, are described below. Here, the totality of the illumination channels used to illuminate the object field 3 are referred to as an illumination setting. An illumination channel is formed in each case by assigning a facet of the first facet mirror to a facet of the second facet mirror. This assignment is adjustable. In particular, it is modifiable. In particular, it can be modified via the control device 23. In general, both the facets of the first facet mirror and the facets of the second facet mirror can be displaceable, in particular swivelable. As a result of this, a variable setting, in particular a control of the illumination setting, is possible. In particular, the facets of the second facet mirror can also have a fixed, i.e., non-displaceable, embodiment.

A parameter P can serve to characterize the quality of the illumination of the object field 3, said parameter also being referred to as performance variable. Corresponding performance variables are, for example, the line width (critical dimension, CD) or the uniformity thereof (CD uniformity, CDU), overlay, imaging telecentricity, HV performance, line edge roughness, line width roughness, tip-to-tip distances of critical features, (18) edge slope (normalized image log slope, NILS), contrast.

In general, the performance variable depends on the properties of the components of the projection exposure apparatus 1, in particular of the illumination system 2 and the projection optical unit 13. In particular, it also depends on the illumination setting that is used to illuminate the reticle 8. In this respect, it was recognized that even small changes in the illumination setting, which may arise in a real system on account of variations and/or disturbances, in particular, may have a significant influence on the performance variables. This leads to the actually realized performance variables often deviating significantly behind the values that are achievable in a best case, as established for an ideal system.

Figure 3:
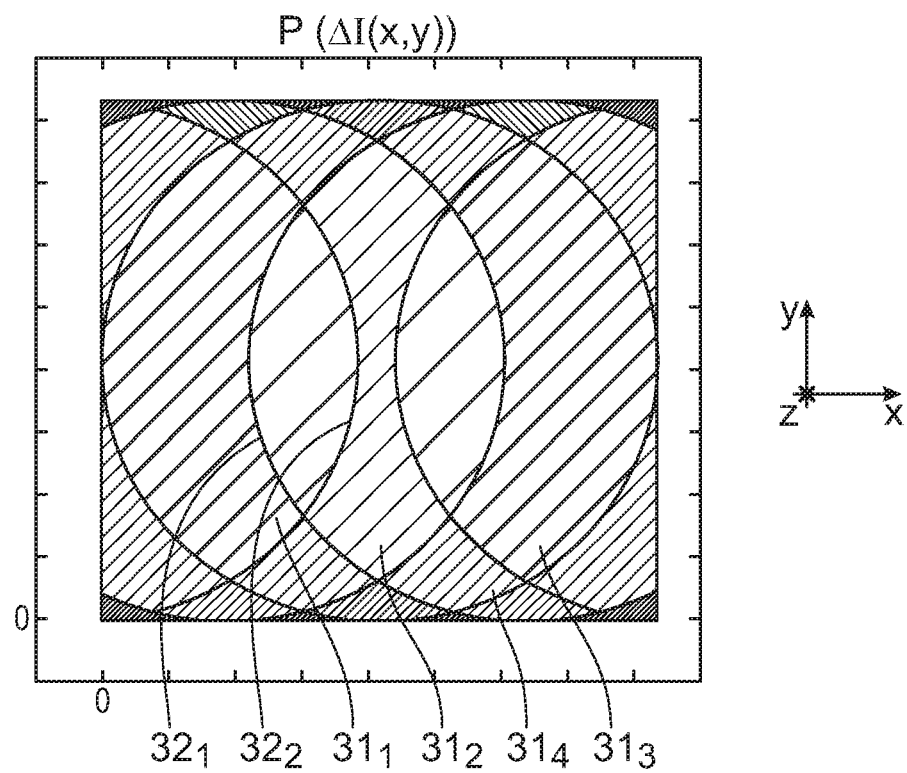

FIG. 3 illustrates, in exemplary fashion, the dependence of a performance variable on a change in intensity $\Delta I(x,y)$ of the illumination radiation 7 in the pupil of the illumination optical unit 6, in particular in the region of the second facet mirror. As it were, this illustration yields a print of the mask 8 and of the illumination optical unit 6 and of the projection optical unit 13 in the pupil plane of the illumination system 2.

In the exemplary illustration of FIG. 3, it is possible to qualitatively identify the formation of a plateau for the chosen performance variable P depending on a change in intensity $\Delta I(x,y)$ of the illumination radiation 7 in the pupil. In particular, it is possible to identify different regions $31_i$, in which the performance variable has a constant sensitivity in respect of changes in intensity of the illumination radiation 7 in the pupil. Expressed differently, the regions $31_i$ represent areas in which a displacement of a pupil spot has no influence, or at best a negligible influence, on the considered performance variable. The regions $31_i$ are separated from one another by transition areas $32_i$ that are delimited relatively sharply.

A displacement of a pupil spot corresponds to the production of intensity at one location and the removal of this intensity from an adjacent location.

As can be gathered qualitatively from FIG. 3, the transition areas $32_i$ are embodied in relatively narrow fashion. Therefore, they are also referred to as edges. If an illumination spot is displaced across such an edge, there is a change in the performance variable in the aerial image. In particular, the transition areas $32_i$ are approximately as wide as an illumination spot. In particular, they are approximately as wide as the size of the plasma image in the pupil.

Figure 4:
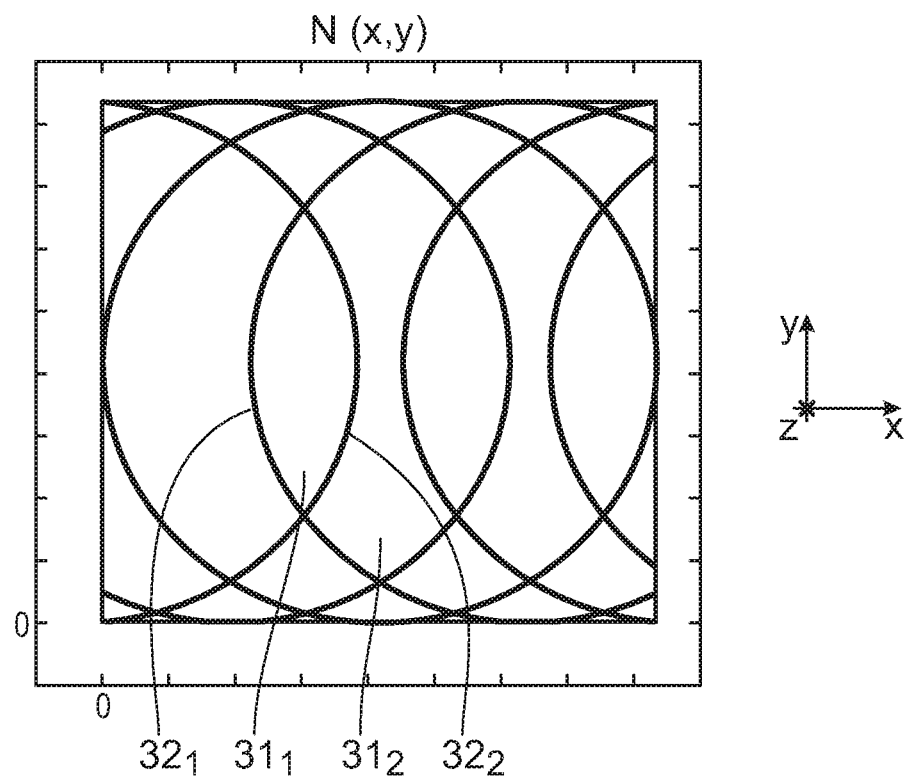

In FIG. 4, these edges are illustrated even more clearly in exemplary fashion. To this end, FIG. 4 illustrates the norm $N(x,y)$ of the directional derivative of the function of the dependence of the performance variable P on the change in intensity of the illumination radiation $\Delta I(x,y)$. By way of example, the Sobel norm serves as a norm $N(x,y)$.

As can be recognized qualitatively from FIG. 4, this norm is only very small in the area of the regions $31i$. In particular, it is at least less than a predetermined maximum value. In principle, this maximum value or the amplitude of the norm can be as desired, but it is desirably still be separable from the apodization of the system. Otherwise, it would not be possible to recognize the formation of the plateau or the formation of the edges. In the transition areas $32_i$, the norm $N(x,y)$ is greater than a predetermined maximum value.

During the so-called source mask optimization (SMO), the pupil, i.e., the illumination setting, is modified by switching over and/or displacing the pupil spot, i.e., by choosing and/or displacing the illumination channels, in such a way that a good compromise is achieved between process window size and throughput. Here, the structure 9 of the mask 8 to be exposed is taken into account. Moreover, the properties of the illumination optical unit 6 and/of the projection optical unit 13 are taken into account.

A process window is created as set forth below: There is a limit to an error in a performance, for example a 5% CD deviation, at which the component to be produced, e.g., a chip, just still operates. Since reaching this limit depends on a plurality of variables, which can be varied independently of one another, for example depth-of-focus and dose variations, the multi-dimensional parameter range, in which the error is smaller than this limit, is referred to as process window. Sometimes, an ellipse or, in a higher dimensional case, a corresponding higher dimensional generalization of an ellipse, which just fits into this area, is referred to as a process window.

One of the goals of the source mask optimization (SMO) is to make the process window as large as possible so that variations in critical dimensions of the system have a minimal influence on the performance variables.

To put it clearly, the method according to the disclosure can be described in view of the process window in such a way that an axis is defined or added as a parameter in the coordinate space for the process window, said axis taking account of system-internal parameters. By way of example, the drift amplitude of the illumination spots can be plotted on such an axis. The process window can be enlarged in the direction of this axis by avoiding the arrangement of illumination spots in certain, prescribed so-called forbidden zones.

Figure 5:
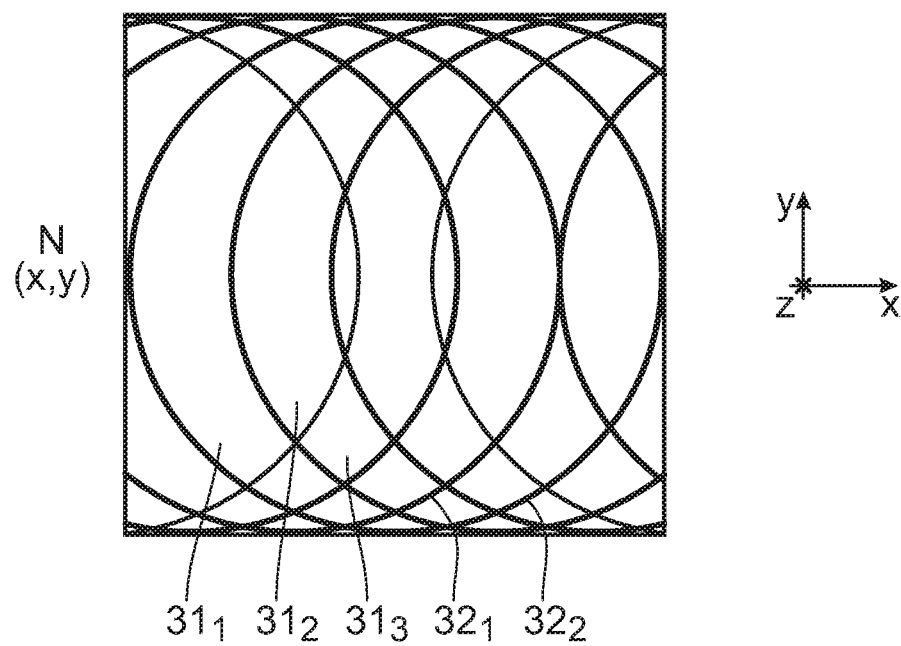
FIG. 5 shows a corresponding illustration as in FIG. 4 for a different mask structure, FIG. 6 schematically shows a simplifying division of the illumination pupil into insensitive, and hence permitted, areas and sensitive, and hence forbidden, areas.
Figure 6:
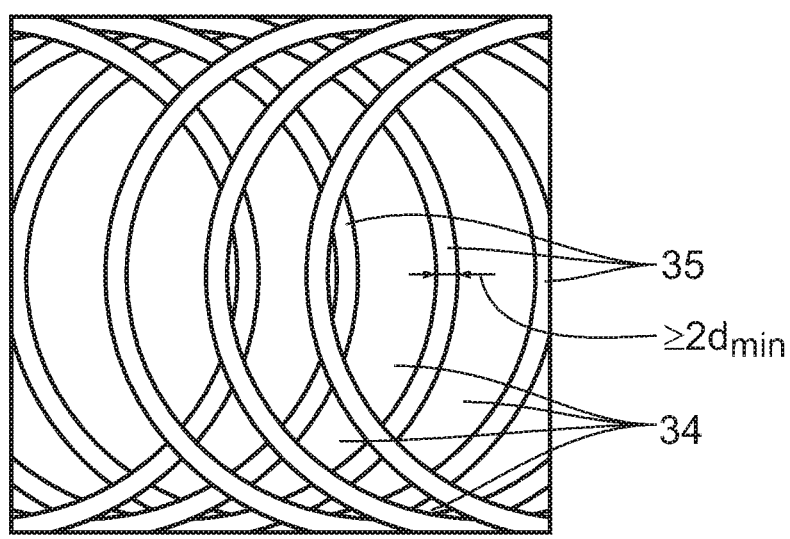

According to the disclosure, provision is made for the position of the transition areas $32_i$ to be taken into account during the source mask optimization. In particular, provision is made for the illumination setting for illuminating the object field 3, in particular for illuminating the mask 8, to be adapted to the values of the norm N(x,y). In particular, the illumination setting is matched to the norm N(x,y) in such a way that no more than a maximum admissible number of pupil spots, in particular no more than 50, in particular no more than 30, in particular no more than 20, in particular no more than 10, in particular no more than 5, in particular no more than 3, in particular no more than 2, in particular no more than 1 pupil spot, preferably no pupil spot, overlap with one of the transition areas $32_i$. In particular, the pupil spots preferably have a predetermined minimum distance $d_{min}$ from the transition areas $32_i$. This is once again clarified in FIG. 6 in exemplary fashion. FIG. 5 shows an illustration of the norm N(x,y) that corresponds to the illustration according to FIG. 4, albeit for a mask 8 with an alternative structure 9. In FIG. 6, the pupil is divided into allowed areas 34 and forbidden areas 35 in a manner corresponding to the position and extent of the regions $31_i$ and transition areas $32_i$. Here, the forbidden areas 35 each have a width of at least 2 $d_{min}$.

The forbidden areas 35 are areas in which a variation of the illumination radiation 7 would lead to significant influence on the performance variable. Therefore, according to the method for setting an illumination setting, these regions are preferably avoided by the pupil spots. Expressed differently, the illumination setting is adapted to the areas 34, 35 in such a way that the plurality of illumination spots, in particular at least 60%, in particular at least 70%, in particular at least 80%, particularly at least 90%, in particular at least 95% of illumination spots, preferably all illumination spots, lie in allowed areas 34.

On the one hand, this may already be implemented when designing the illumination system 2, in particular when designing the pupil facet mirror.

In particular, obscured regions of the projection optical unit can be taken into account when designing the pupil facet mirror. In particular, the pupil facet mirror can be designed in such a way that none of the pupil facets are arranged in such a way that they lead to a beam path of the illumination radiation which falls in the region of an edge of an obscured region in the projection optical unit. When considered the other way around, this corresponds to an arrangement such that all of the pupil facets have a minimum distance from the image of the zero order of diffraction of the aperture of the projection optical unit in the case of diffraction at the structures of the reticle. Here, the image of the zero order of diffraction is independent of the structure of the reticle. Consequently, a corresponding embodiment of the pupil facet mirror leads to improved optical properties, independently of the structure of the reticle.

Figure 12:
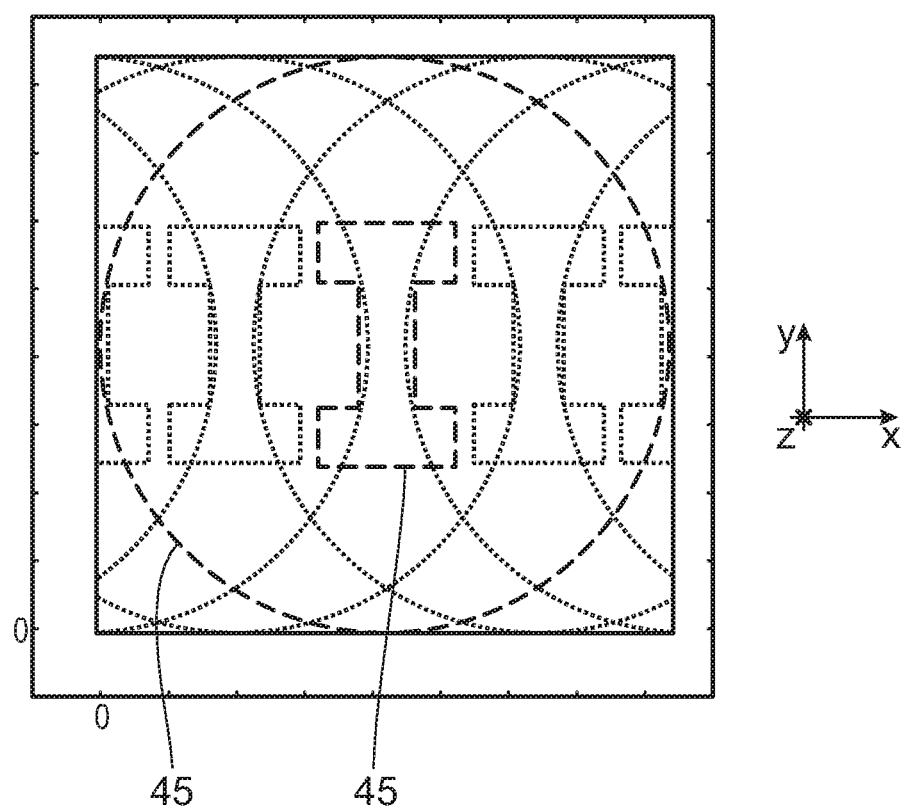

Consequently, the pupil facets are arranged on the pupil facet mirror in such a way that there is at least one simple path-connected area in which no pupil facets are arranged, wherein the form of this area corresponds to a boundary of an obscuration of the aperture of the projection optical unit, particularly precisely one scaled image 45 of the edge of such an obscuration, and wherein this region has a minimum width at each location, said minimum width corresponding to the above-described minimum distance of a facet from an edge area. This is illustrated in FIG. 12 in exemplary and schematic fashion. In FIG. 12, the mask-structure-independent scan of the aperture of the projection optical unit with the zero order of diffraction of the illumination pupil is marked as a dashed line, in particular. In particular, the dashed lines just correspond to the image 45 of the edge of an obscured area of the projection optical unit. Higher orders of diffraction of the image 45 of the edge are illustrated using dots in FIG. 12.

In the case of displaceable facets, in particular controllably displaceable facets, such an adaptation can also be undertaken in a completed projection exposure apparatus 1. According to an advantageous alternative, the adaptation can also be undertaken during the operation of the projection exposure apparatus 1. In particular, it is possible to take account of online variations in the illumination radiation, in particular geometric variations of same and/or disturbances, for example vibrations of the components of the projection exposure apparatus 1, online. A sensor 26, which is connected in signal-transmitting fashion to the control device 23, is provided for capturing corresponding variations and/or disturbances. In particular, the sensor 26 can be arranged in the region of the object plane 4. It may also be arranged in the region of the optical element 22. Alternatives are likewise possible.

Figure 7:
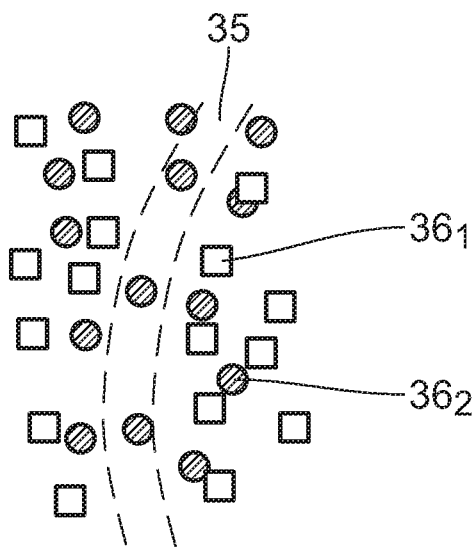
FIG. 7 shows exemplary illustrations of two distributions of illumination spots in a section of the illumination pupil.
Figure 8:
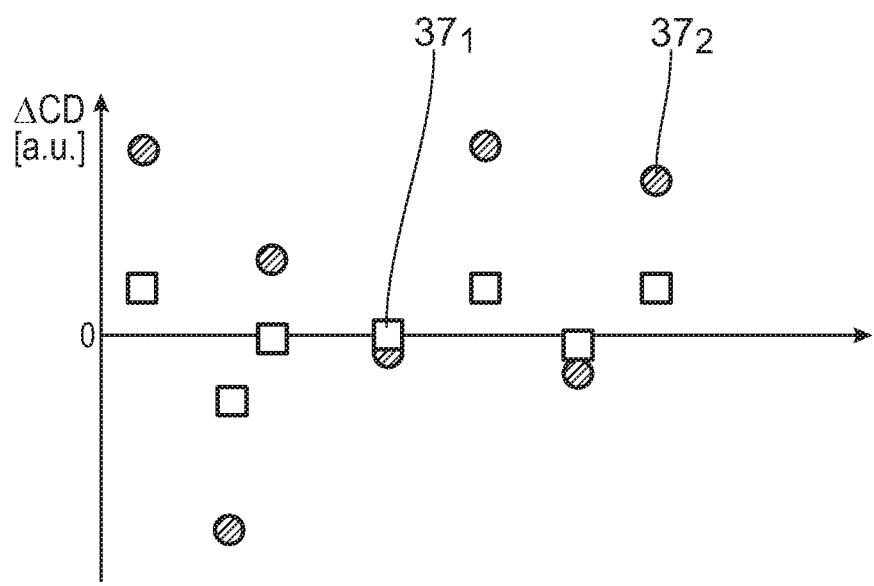
FIG. 8 shows a sensitivity of the selected performance variable (CD error) in respect of statistical geometric variations of the illumination spots of the illumination pupil, in each case prior to an optimization of the position of the illumination spots (circles) and after an optimization taking account of the forbidden areas (squares); in each case different, independent, statistically disturbed variations of corresponding distributions of the illumination spots are plotted along the x-axis.

For the purposes of clarifying the advantages that are obtainable according to the disclosure, FIG. 7 illustrates, in exemplary fashion, a section of an illumination pupil with different distributions of the pupil spots $36_1$, $36_2$ and FIG. 8 illustrates the deviation ΔCD of the line width CD from the intended line width $37_1$, $37_2$ of the corresponding illumination pupils in relation to static, geometric variations in the positions of the pupil spots $36_1$, $36_2$ as a specific example of variations and/or disturbances of the illumination radiation 7 and/or of the components of the illumination optical unit 6. Here, discrete different statistically geometrically disturbed pupils are plotted on the x-axis of FIG. 8 in each case.

As can be clearly gathered from FIG. 8, the arrangement of the pupil spots $36_2$ only in the allowed areas 34 leads to a significant improvement of the deviation ΔCD for the case of drifting illumination spots.

The arrangement of the pupil spots $36_1$, $36_2$ can be understood to be an arrangement of the second facets on the second facet mirror. This arrangement can be taken into account when designing the second facet mirror. In particular, it can be predetermined in the form of hardware. It can also be set via the control device 23, in particular set dynamically, in particular set with software assistance.

Figure 9:
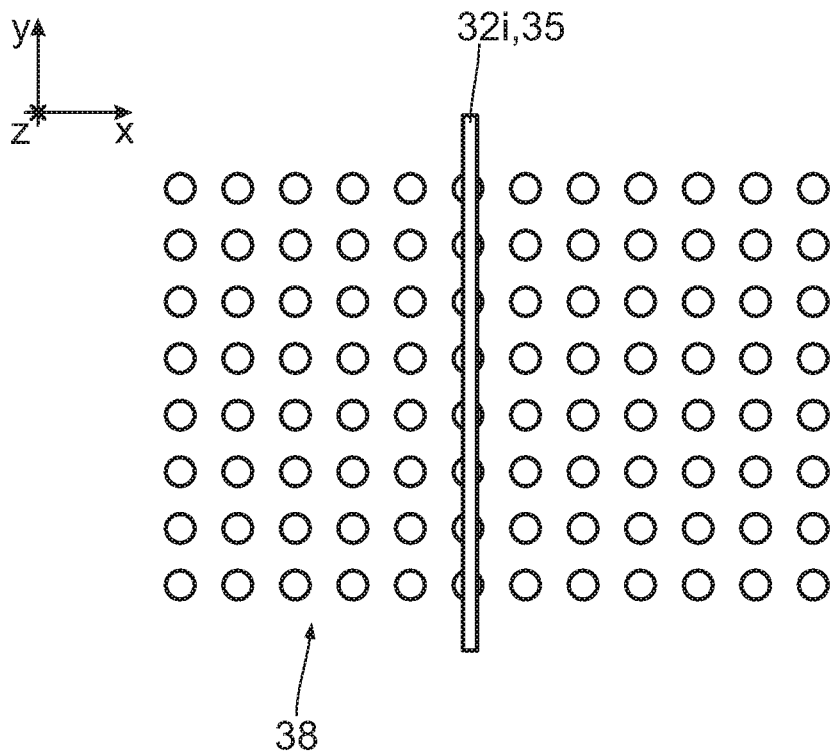
FIG. 9 shows exemplary illustrations of an inexpedient alignment of a pupil grid.
Figure 10:
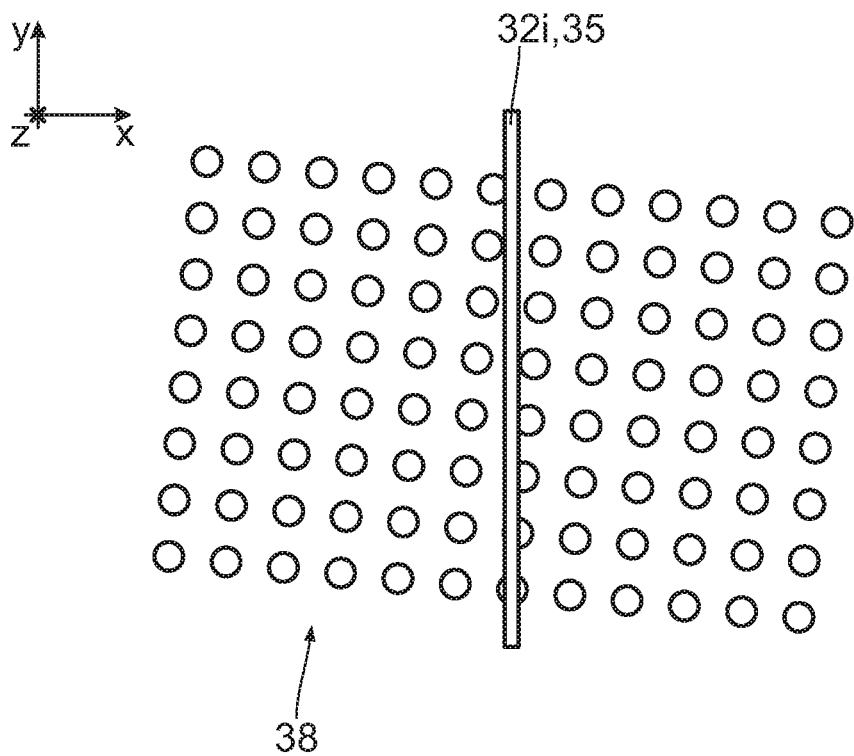
FIG. 10 shows, in schematic and exemplary fashion, an adapted alignment of the pupil grid according to FIG. 9, FIG. 11 schematically shows a method for adapting the illumination pupil and FIG. 12 schematically shows an image of an obscured aperture of the projection optical unit, as viewed from the illumination pupil.
Figure 11:
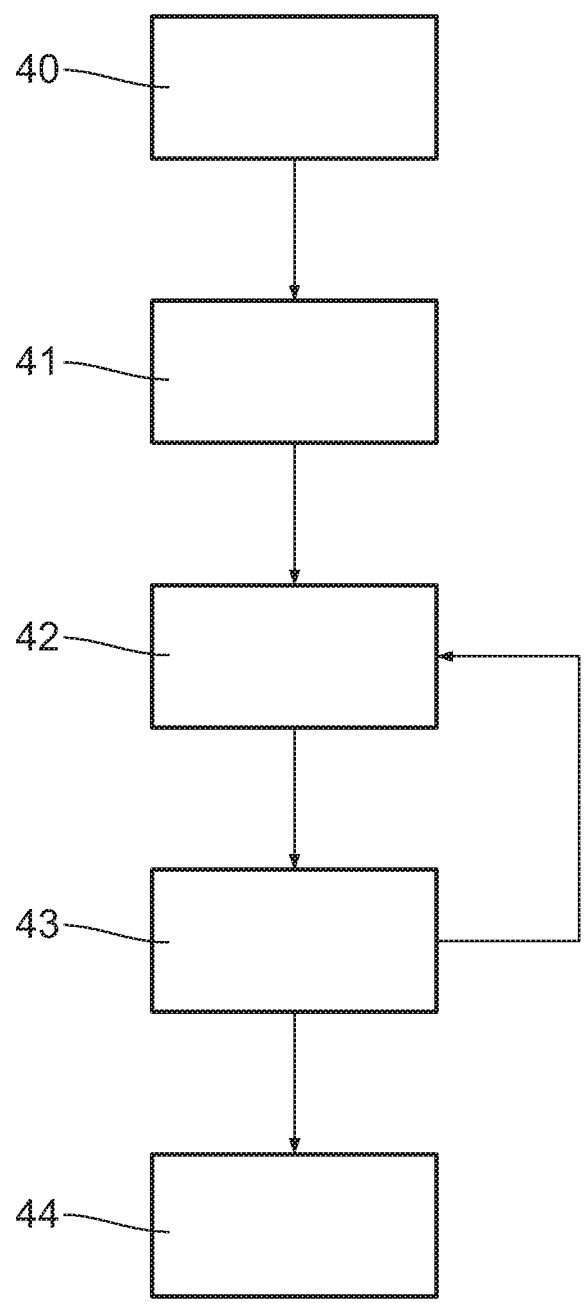

FIGS. 9 and 10 should explain how the method can already be taken into account when designing the second facet mirror. FIGS. 9 and 10 illustrate, in exemplary fashion, the relative position of one of the transition areas $32_i$ or one of the forbidden areas 35 relative to a pupil grid 38. The pupil grid 38 schematically reproduces the arrangement of the second facets on the second facet mirror.

The profile of the forbidden areas 35 and the specific illustration of the pupil grid 38 are schematic and purely exemplary, and should not be construed as restrictive.

The profile of the transition areas $32_i$ depends, inter alia, on the details of the structure 9 of the mask 8 and on the details of aperture stops of the projection optical unit 13.

FIG. 9 illustrates an inexpedient case in exemplary fashion, in which a large number of pupil spots, i.e., the position of the second facet elements, overlap with the forbidden area 35. This situation can be improved (see FIG. 10) by rotating the pupil grid 38 relative to the forbidden area 35, i.e., relative to the optical axis 12 that corresponds to the coordinate system plotted in the z-direction. In particular, the pupil grid 38 is rotated relative to the alignment of the mask 8, in particular relative to the alignment of the structures 9 of the mask 8, which act as diffraction structures for the illumination radiation 7. As an alternative or in addition thereto, the pupil grid 38 can be displaced relative to the optical axis 12, in particular in the direction perpendicular thereto, in particular relative to the mask 8.

Already in the case of a tolerance-free system, the arrangement of the pupil spots relative to the forbidden area 35 as illustrated in FIG. 10 in exemplary fashion is more expedient than the variant illustrated in FIG. 9 since the geometric field variation of an individual pupil spot only comes to bear in the case of a few spots, which lie exactly at the edge. For a system afflicted by tolerances, the arrangement according to FIG. 10 is more expedient than the arrangement according to FIG. 9, in particular for systematic disturbance, for example a horizontal drift of all spots.

Further aspects and alternatives of the method according to the disclosure are described below in a brief summary. They are equally applicable to the different above-described alternatives.

One or more performance variables can be taken into account for the purposes of adapting the illumination setting.

One or more specifically predetermined masks 8 with different structures 9 and/or aperture stops and/or properties of the illumination radiation 7, in particular a diameter of a beam with illumination radiation 7, can be taken into account when determining the functional dependence of the performance variables on the change in intensity of the illumination radiation 7 in the illumination pupil.

An optimization method can be used for adapting the illumination pupil. Here, it is possible to take account of additional boundary conditions, for example a predetermined minimum number of pupil spots.

The predetermined minimum distance $d_{min}$ of the individual pupil spots from the transition areas $32_i$ can be determined depending on expected variations in the illumination radiation 7 and/or disturbances of the components of the projection exposure apparatus 1, in particular of the illumination optical unit 6 and/or the projection optical unit 13.

The adaptation of the illumination pupil need not necessarily occur exactly in a pupil plane. In particular, the second faceted element can be arranged at a distance from a pupil plane. This alternative is also referred to as a specular reflector.

The illumination pupil can be adapted with the assistance of software. Below, a method for computer-assisted adaptation of the illumination pupil is described in exemplary fashion.

To this end, the relevant performance properties of the aerial image is initially be modeled. To this end, provision is made of an imaging simulation or else of simplified variations thereof.

The modeling can also be assisted by metrology. In particular, it is possible to take account of previously measured information items about the system and/or the method. In particular, this may be advantageous for calibrating the model and/or the simulation tools.

Subsequently, all performance variables that are considered to be relevant are reduced to a scalar. In particular, the aforementioned performance variables can be considered as performance variables, and also the uniformity of the illumination of the object field, transmission, throughput, conventional telecentricity and ellipticity. Reducing the relevant performance variables to a scalar can be obtained with the aid of a merit function. By way of example, two variables can be combined to form a scalar by way of a weighted sum of their squares.

The goal of the software or of the method for adapting the illumination pupil lies in finding the extremum of this merit function. Depending on the formulation of the problem, this often relates to a minimum of this function.

Avoiding the above-described forbidden zones of forbidden areas 35 can be taken into account as an additional condition in this optimization method.

The method is, in particular, an iterative method. In particular, the method includes the following steps:

A prescription step 40 for prescribing a set pupil.

A calculation step 41 for establishing the forbidden areas 35.

An assessment step 42 for establishing the merit function and/or for establishing how many of the illumination spots lie within the forbidden areas 35 or overlap with the latter.

A variation step 43, in which the illumination pupil is varied in such a way that the merit function is improved or at least remains constant while, at the same time, the number of illumination spots in the forbidden areas is reduced. After the variation step, another assessment can be carried out via the assessment step 42. The loop with the assessment step 42 and the variation step 43 can be implemented until the best possible compromise is achieved between the value of the merit function and the number of illumination spots in the forbidden areas 35.

To the extent that this is necessary and/or desired, it is also possible to carry out the calculation step 41 again. This may be expedient if the pupil, for example more than 10% of the illumination spots, has changed during the optimization. By carrying out the calculation step 41 again, it is possible to ensure that the sensitivity calculation fits to the current optimization situation. Provided a predetermined termination criterion was reached, the result can be checked once again in a verification step 44. This can be implemented experimentally or via numerical simulations.

Predetermined boundary conditions can be taken into account in a targeted manner during the variation step 43. By way of example, it is possible to prescribe that a minimum/maximum number of pupil spots lie in predetermined areas of the pupil in each case. Moreover, it is possible to take particular account of certain performance parameters in this method.

What is claimed is:

1. A method for setting an illumination setting for illuminating an object field of a projection exposure apparatus, the projection exposure apparatus comprising an illumination system configured to illuminate the object filed with illumination radiation, the method comprising:
prescribing a parameter to characterize a quality of the illumination of the object field;
determining a spatially resolved function of the dependence of the parameter on a change in the intensity of illumination radiation in an illumination pupil of the illumination system;
determining a norm of a directional derivative of the spatially resolved function; and
adapting the illumination setting for illuminating the object field to the norm.

2. The method of claim 1, wherein the parameter is selected from the group consisting of line width (critical dimension), overlay, imaging telecentricity, critical dimension uniformity, HV performance, line edge roughness, line width roughness, tip-to-tip distances of critical features, edge slope (normalized image log slope), and contrast.

3. The method of claim 2, further comprising, determining the spatially resolved function, taking into account at least one member selected from the group consisting of a prescribed structure of a mask, an aperture stop, and a diameter of a cross section of the illumination radiation.

4. The method of claim 1, further comprising, determining the spatially resolved function, taking into account at least one member selected from the group consisting of a prescribed structure of a mask, an aperture stop, and a diameter of a cross section of the illumination radiation.

5. The method of claim 4, further comprising, to adapt the illumination pupil, adapting at least one member selected from the group consisting of a distribution of a plurality of pupil spots and an intensity of a plurality of pupil spots.

6. The method of claim 3, further comprising, to adapt the illumination pupil, adapting at least one member selected from the group consisting of a distribution of a plurality of pupil spots and an intensity of a plurality of pupil spots.

7. The method of claim 2, further comprising, to adapt the illumination pupil, adapting at least one member selected from the group consisting of a distribution of a plurality of pupil spots and an intensity of a plurality of pupil spots.

8. The method of claim 1, further comprising, to adapt the illumination pupil, adapting at least one member selected from the group consisting of a distribution of a plurality of pupil spots and an intensity of a plurality of pupil spots.

9. The method of claim 1, further comprising, to adapt the illumination pupil, displacing a plurality of pupil spots via a plurality of individual mirrors of a facet mirror of the illumination system.

10. The method of claim 9, further comprising, to adapt the illumination pupil, rotating the illumination pupil and/or displacing the illumination pupil as a whole.

11. The method of claim 1, further comprising, to adapt the illumination pupil, adapting an arrangement of facets on a facet mirror to the norm so that at least a subset of facet mirrors has a predetermined minimum distance from areas in which the norm is greater than a predetermined maximum value.

12. The method of claim 1, further comprising adapting the illumination setting during the exposure of a wafer.

13. The method of claim 1, further comprising:
to adapt the illumination setting, defining a coordinate system for a process window in which at least one coordinate corresponds to one or more system-internal parameters of the illumination system; and
adapting the illumination setting so that the process window is increased in the direction of the at least one coordinate.

14. The method of claim 2, further comprising:
to adapt the illumination setting, defining a coordinate system for a process window in which at least one coordinate corresponds to one or more system-internal parameters of the illumination system; and
adapting the illumination setting so that the process window is increased in the direction of the at least one coordinate.

15. A system, comprising:
a microlithography illumination unit comprising:
a first facet mirror comprising a multiplicity of first facets;
a second facet mirror comprising a multiplicity of second facets; and
one or more processing devices; and
one or more machine-readable hardware storage devices, wherein:
each first facet is assignable to a second facet to define an illumination channel so that a totality of the illumination channels defines an illumination setting to illuminate an object field; and
the one or more machine-readable hardware storage devices comprise instructions that are executable by the one or more processing devices to perform the method of claim 1.

16. The system of claim 15, wherein one or more machine-readable hardware storage devices comprise memory configured to save values of the norm.

17. The system of claim 16, further comprising a radiation source configured to produce the illumination radiation.

18. The system of claim 17, further comprising a projection optical unit configured to image a reticle in the object field into an image field.

19. A method of using a system comprising an illumination optical unit, a projection optical unit, one or more processing devices and one or more machine-readable hardware storage devices, the illumination optical unit comprising a first facet mirror comprising a multiplicity of first facets and a second facet mirror comprising a multiplicity of second facets the method comprising:
Using the illumination optical unit to illuminate a reticle;
Using the projection optical unit to project illuminated structures on the reticle onto a radiation-sensitive material,
wherein:
the one or more machine-readable hardware storage devices comprise instructions to perform operations comprising the method of claim 1; and
the method further comprises using the one or more processing devices to perform the operations.

* * * * *

UNITED STATES PATENT AND TRADEMARK OFFICE
CERTIFICATE OF CORRECTION

PATENT NO. : 10,514,606 B2
APPLICATION NO. : 16/248413
DATED : December 24, 2019
INVENTOR(S) : Alexander Winkler et al.

Page 1 of 1

It is certified that error appears in the above-identified patent and that said Letters Patent is hereby corrected as shown below:

In the Specification

Column 8, Line 3, delete "a of" and insert -- of --;

Column 10, Line 57, delete "31i." and insert -- $31_i$. --;

Column 11, Line 5, delete "and/of" and insert -- and/or --.

Signed and Sealed this
Seventh Day of April, 2020

Andrei Iancu
*Director of the United States Patent and Trademark Office*